(12) United States Patent
Chidambarrao et al.

(10) Patent No.: US 8,541,814 B2
(45) Date of Patent: Sep. 24, 2013

(54) MINIMIZING LEAKAGE CURRENT AND JUNCTION CAPACITANCE IN CMOS TRANSISTORS BY UTILIZING DIELECTRIC SPACERS

(75) Inventors: Dureseti Chidambarrao, Weston, CT (US); Ramachandran Muralidhar, Mahopac, NY (US); Philip J Oldiges, Lagrangeville, NY (US); Viorel Ontalus, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 13/084,594

(22) Filed: Apr. 12, 2011

(65) Prior Publication Data

US 2012/0261672 A1    Oct. 18, 2012

(51) Int. Cl.
*H01L 27/092*    (2006.01)
(52) U.S. Cl.
USPC .................... 257/190; 257/192; 257/E27.062
(58) Field of Classification Search
USPC .......... 257/192, 204, 288, 347, 190, E27.062, 257/E27.112
See application file for complete search history.

(56) References Cited

U.S. PATENT DOCUMENTS

| 6,399,973 | B1 | 6/2002 | Roberds |
| 6,977,419 | B2 | 12/2005 | Wang et al. |
| 7,176,116 | B2 | 2/2007 | Cabral, Jr. et al. |
| 7,342,266 | B2 | 3/2008 | Belyansky et al. |
| 7,399,663 | B2 * | 7/2008 | Hoentschel et al. .......... 438/151 |
| 7,439,164 | B2 | 10/2008 | Langdo et al. |
| 7,682,916 | B2 | 3/2010 | Murthy et al. |
| 2006/0267108 | A1 | 11/2006 | Patil |
| 2008/0034335 | A1 | 2/2008 | Cheng et al. |
| 2010/0090266 | A1 * | 4/2010 | Kumazaki ..................... 257/316 |

* cited by examiner

*Primary Examiner* — Tran Tran
(74) *Attorney, Agent, or Firm* — Abdul-Samad A. Adediran; Matthew Zehrer; Joseph Petrokaitis

(57) ABSTRACT

A semiconductor structure and method for forming dielectric spacers and epitaxial layers for a complementary metal-oxide-semiconductor field effect transistor (CMOS transistor) are disclosed. Specifically, the structure and method involves forming dielectric spacers that are disposed in trenches and are adjacent to the silicon substrate, which minimizes leakage current. Furthermore, epitaxial layers are deposited to form source and drain regions, wherein the source region and drain regions are spaced at a distance from each other. The epitaxial layers are disposed adjacent to the dielectric spacers and the transistor body regions (i.e., portion of substrate below the gates), which can minimize transistor junction capacitance. Minimizing transistor junction capacitance can enhance the switching speed of the CMOS transistor. Accordingly, the application of dielectric spacers and epitaxial layers to minimize leakage current and transistor junction capacitance in CMOS transistors can enhance the utility and performance of the CMOS transistors in low power applications.

8 Claims, 6 Drawing Sheets

MINIMIZING LEAKAGE CURRENT AND JUNCTION CAPACITANCE IN CMOS TRANSISTORS BY UTILIZING DIELECTRIC SPACERS

TECHNICAL FIELD

The present invention relates to a semiconductor, and more particularly to a complementary metal-oxide-semiconductor field effect transistor with minimized leakage current and transistor junction capacitance.

BACKGROUND

Complementary metal-oxide-semiconductor field effect transistors (CMOS transistors) are often utilized in low power applications, such as low leakage electronic devices that require minimal electrical power consumption. One important application for CMOS transistors is in battery operated low leakage electronic devices, wherein battery lifetime is essential.

Leakage power refers to the rate at which electrical energy is consumed by an electronic device that is on, but not performing useful work. Leakage power arises from leakage current that is inherent in CMOS transistors. Specifically, in the context of CMOS transistors, leakage current refers to current that flows through a CMOS transistor when the CMOS transistor is off but the electronic device utilizing the CMOS transistor is on, which can result in electrical energy being dissipated even though the electronic device is not performing useful work. As CMOS transistors become smaller the length of the transistor channel region under the gates becomes shorter, which can result in increased leakage current and electrical energy dissipation. Generally, leakage current is undesirable, because electrical energy (e.g., battery power) is dissipated by an electronic device without the device performing useful work. Maintaining minimal leakage current has become increasingly difficult to accomplish as the size of CMOS transistors become smaller.

SUMMARY

The present invention relates to a structure and method of forming complementary metal-oxide-semiconductor field effect transistors (CMOS transistors) with epitaxial layers that can provide stress, wherein the CMOS transistors utilize dielectric spacers to minimize leakage current and transistor junction capacitance. Minimizing leakage current and transistor junction capacitance can enhance the utility and performance of CMOS transistors mostly in low power applications.

A first aspect of the present invention provides a semiconductor device comprising: a substrate; gates disposed on the substrate and spaced at a distance from each other, wherein a first dielectric spacer is disposed on and adjacent to the gate; one or more trenches in the substrate between each of the gates; a second dielectric spacer disposed on and adjacent to the first dielectric spacer and the substrate between the gates, wherein a portion of the second dielectric spacer is removed; and one or more epitaxial layers disposed on and adjacent to the second dielectric spacer, and a portion of the substrate between the gates.

A second aspect of the present invention provides a method of forming a semiconductor device, the method comprising the steps of: providing a substrate; forming gates disposed on the substrate and spaced at a distance from each other, wherein a first dielectric spacer is disposed on and adjacent to the gate; forming one or more trenches in the substrate between each of the gates; forming a second dielectric spacer disposed on and adjacent to the first dielectric spacer and the substrate between the gates, wherein a portion of the second dielectric spacer is removed; and forming one or more epitaxial layers disposed on and adjacent to the second dielectric spacer, and a portion of the substrate between the gates.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1A:
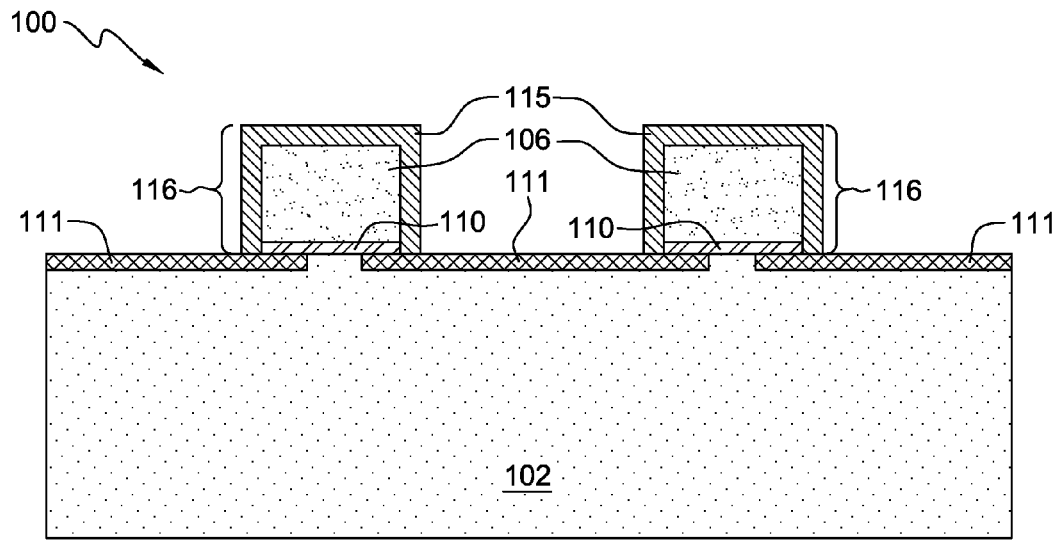
FIGS. 1A-1E are cross-sectional views of semiconductor structures at various stages during the fabrication of a complementary metal-oxide-semiconductor (CMOS) field effect transistor comprising dielectric spacers according to one embodiment of the present invention.

The drawings are not necessarily to scale. The drawings, which are merely pictorial cross-sectional views, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Moreover, although the embodiments depicted herein are shown in two dimensional views with various regions having width and depth, it should be clearly understood that these regions are illustrations of only a portion of a single unit of a device, which may include a plurality of such units arranged in a three-dimensional structures.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provide complementary metal-oxide-semiconductor field effect transistors (CMOS transistors) with epitaxial layers that can provide stress, wherein the CMOS transistors utilize dielectric spacers to minimize leakage current and transistor junction capacitance. Minimizing leakage current and transistor junction capacitance can enhance the utility and performance of CMOS transistors in low power applications. Moreover, in the present embodiment the semiconductor structure and method are described in the context of gate first process, wherein first a gate is formed, followed by formation of extensions and source and drain regions, and the rest of front-end-of-line processing. However, the structure and method described herein is also applicable in the context of replacement metal gate process, wherein a dummy gate is initially formed, and wherein the dummy gate is later replaced with a final gate stack during front-end-of-line processing.

FIG. 1A illustrates a cross-sectional view of semiconductor 100 comprising a substrate 102, extensions 111, and gates 116, wherein each of the gates comprise a gate dielectric layer 110, a poly-silicon and/or metal layer 106, and a first dielectric spacer 115. The number of gates 116 corresponds to the number of transistors. Gate dielectric layer 110 can comprise an oxide, such as silicon dioxide, hafnium oxide, or zirconium oxide. In addition, gate dielectric layer 110 is deposited on a portion of substrate layer 102 utilizing a chemical vapor deposition (CVD) process or any other conventional process. First dielectric spacer 115 comprises nitride, oxide, or any other dielectric material. Moreover, if gates 116 comprise a metal layer then the metal layer can include hafnium, zirconium, or tantalum, wherein the metal layer is deposited on gate dielectric layer 110 utilizing a CVD process, a physical vapor deposition (PVD) process, or any other conventional process. Furthermore, in one embodiment if gates 116 comprise a metal layer, a layer of poly-silicon can be deposited on the metal layer. Subsequently, sometime after formation of the poly-silicon and/or metal layer 106, first dielectric spacer 115 is disposed on and adjacent to the poly-silicon and/or metal layer, disposed adjacent to gate dielectric 110, and disposed on a portion of substrate 102 thereby encapsulating the poly-silicon and/or metal layer and the gate dielectric to form the gates. After formation of gates 116, extensions 111 can be formed utilizing an implant technique, such as ion implantation followed by an annealing process which can cause the ion dopants to diffuse deeper and laterally into substrate 102, and diffuse slightly under the gates.

Figure 1B:
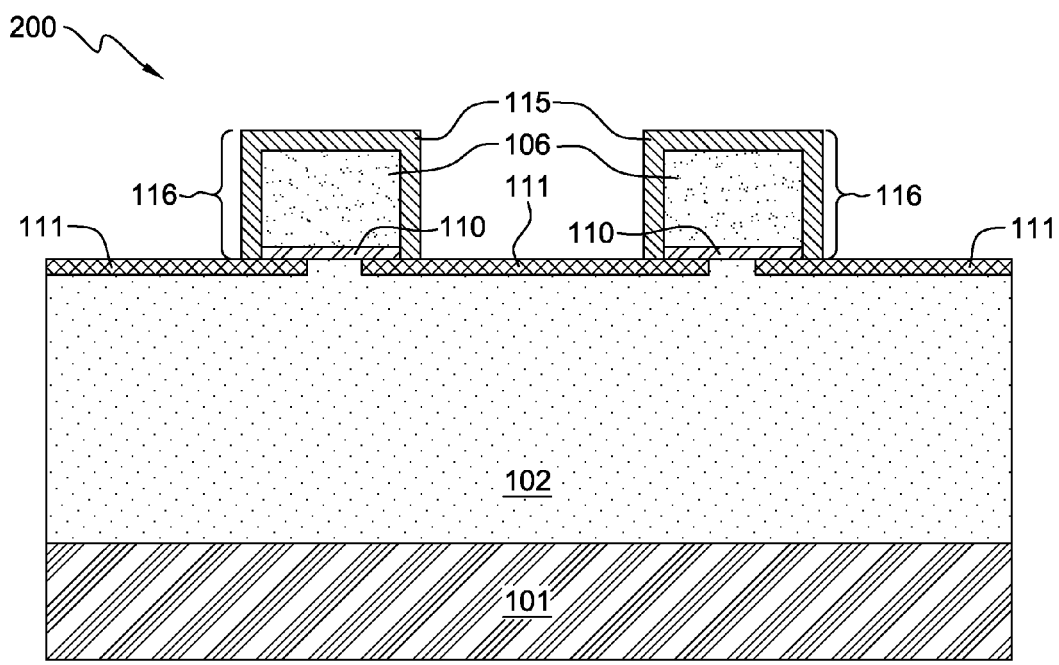

In the present embodiment, semiconductor 100 is a p-type CMOS transistor. Therefore, substrate 102 is n-type silicon that can be doped with n-type dopants that include arsenic or phosphorus, but other n-type dopants can be utilized. In alternative embodiments, semiconductor 100 can be an n-type CMOS transistor, in such a case substrate 102 will be p-type silicon that can be doped with p-type dopants that can include boron or other p-type dopants. In addition, in the present embodiment, semiconductor 100 is fabricated utilizing bulk silicon. However, in alternative embodiments a semiconductor can be fabricated utilizing silicon-on-insulator. FIG. 1B illustrates such an alternative embodiment, at a stage in the fabrication process, wherein a semiconductor 200 is fabricated utilizing silicon-on-insulator, and wherein silicon substrate 102 is disposed on an oxide layer 101. Specifically, semiconductor 200 comprises oxide layer 101, substrate 102, extensions 111, and gates 116, wherein each of the gates comprise gate dielectric layer 110, poly-silicon and/or metal layer 106, and first dielectric spacer 115.

Figure 1C:
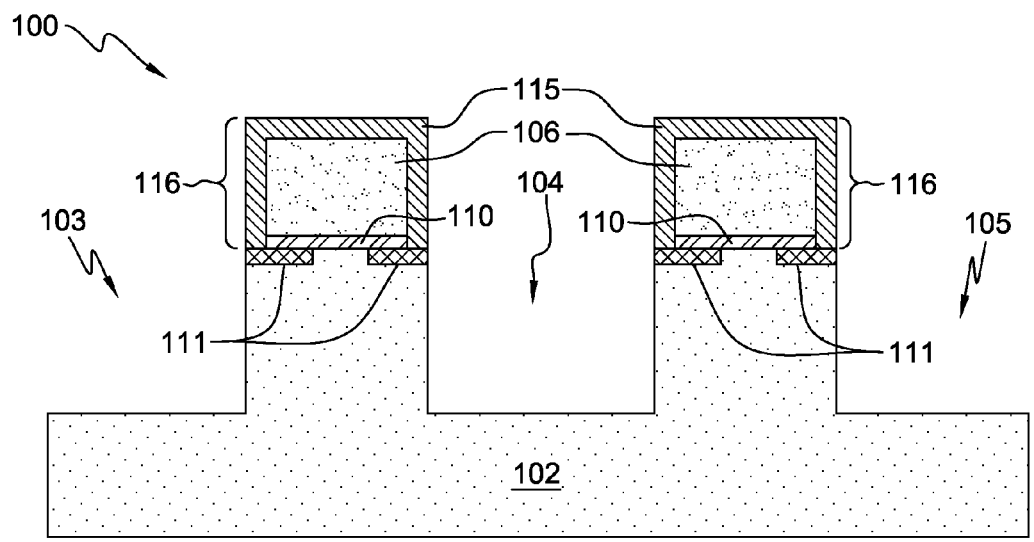
Figure 1D:
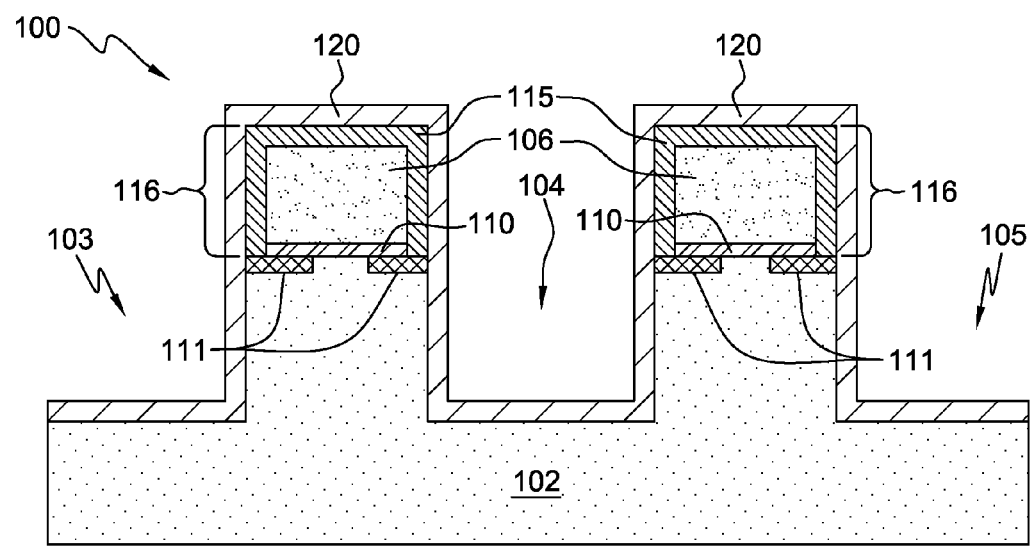
Figure 1E:
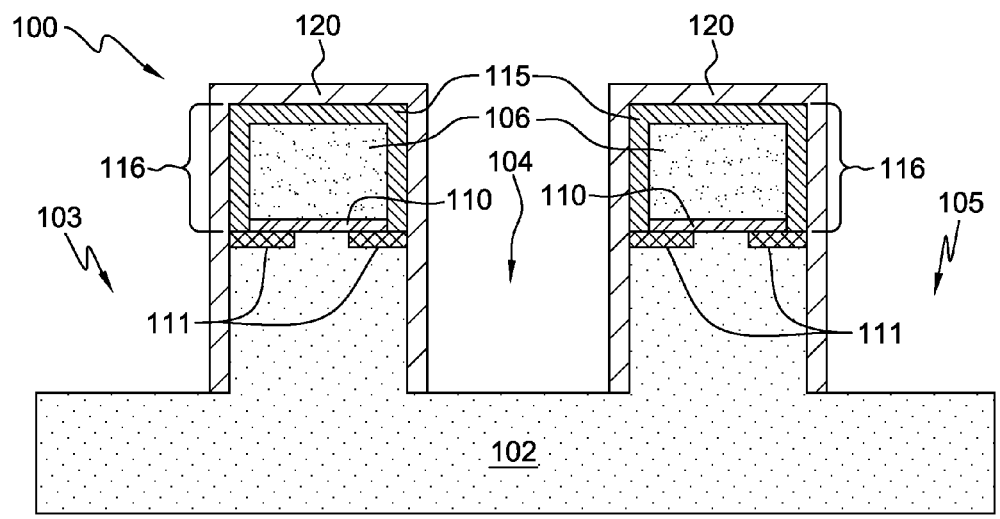

FIG. 1C illustrates a cross-sectional view of semiconductor 100 comprising substrate 102 and extensions 111, wherein trenches 103-105 are formed in the substrate utilizing reactive ion etching (RIE) or any other conventional etching/removal technique. Specifically, a portion of substrate 102 and a portion of extensions 111 are removed via anisotropic RIE, or other conventional methods. Subsequently, in FIG. 1D, a second dielectric spacer 120 is disposed on and adjacent to first dielectric spacer 115 and substrate 102, and disposed adjacent to extensions 111. In FIG. 1E, portions of second dielectric spacer 120 are removed from trenches 103-105. In the present embodiment, substrate 102 utilized to fabricate semiconductor 100 is bulk silicon, however in alternative embodiments semiconductor 100 may be fabricated utilizing a silicon-on-insulator technology, wherein substrate 102 is disposed on an oxide layer.

Figure 1F:
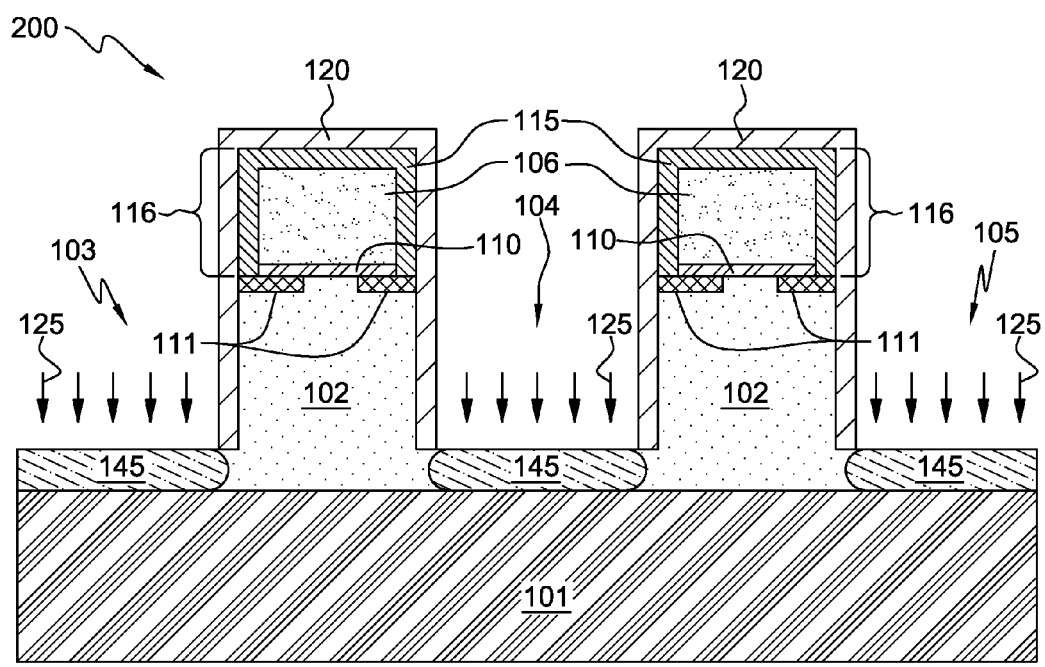
FIG. 1F is a cross-sectional view illustrating an optional junction-butting implant process according to one embodiment of the present invention.

FIG. 1F, illustrates a cross-sectional view of an alternative embodiment, wherein the semiconductor 200 (also shown in FIG. 1B) is fabricated utilizing silicon-on-insulator technology, and wherein substrate 102 is disposed on an oxide layer 101. An optional junction-butting implant 125 can be performed, utilizing ion implantation, when silicon-on-insulator technology is implemented. Optional junction-butting implant 125 provides dopants (i.e., p-type or n-type depending on the doping profile of the substrate) to substrate 102 to form a junction-butting implant layer 145. A purpose of junction-butting implant layer 145 is to electrically decouple portions of body regions (i.e., the body regions are substrate 102 under gates 116) of adjacent transistors. Thus, isolating portions of the body regions of adjacent transistors can prevent electrical coupling between the adjacent transistors. Furthermore, the presence of second dielectric spacer 120 mitigates lateral straggle of implanted dopants into body regions (i.e. the substrate 102 under gates 116). Lateral straggle is defined as the scattering of ions, during ion implantation, at angles away from the direction of implantation, wherein some of the ions spread laterally outside of the ion implantation region. Moreover, a junction-butting implant 145 can be formed if a semiconductor is fabricated using bulk silicon, or even if the semiconductor is fabricated using silicon-on-insulator technology.

Figure 1G:
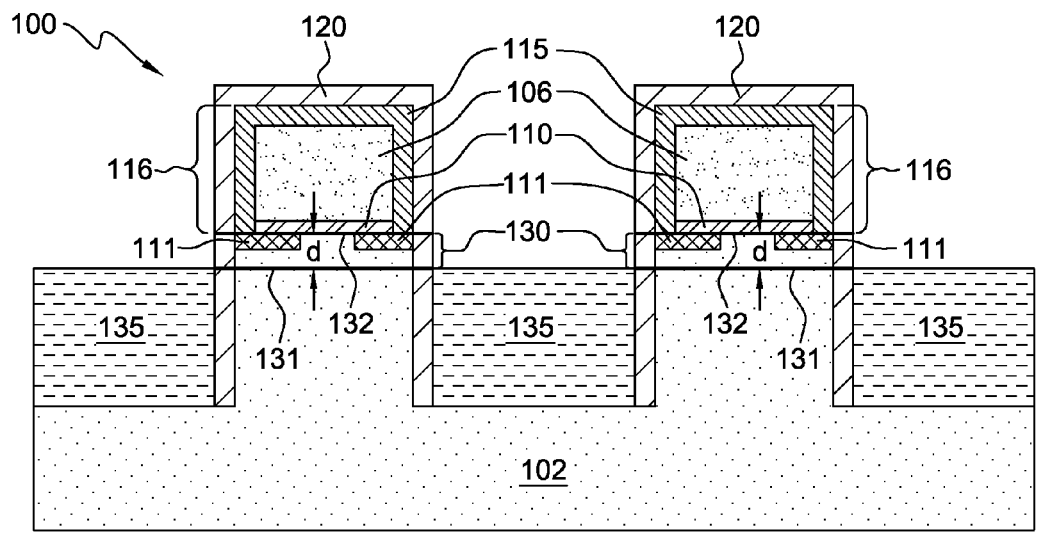
FIGS. 1G-1I are cross-sectional views of semiconductor structures at various stages during the fabrication of a CMOS field effect transistor comprising dielectric spacers according to one embodiment of the present invention.

FIG. 1G, illustrates a cross-sectional view of semiconductor 100 at a successive stage of fabrication, wherein substrate 102 utilized to fabricate the semiconductor is bulk silicon. Epitaxial layer 135 can be formed from bottom of trenches 103-105 (shown in FIG. 1E) up to a distance 'd' below the gate dielectric 110, wherein the distance 'd' is about 5-30 nanometers, and wherein the distance 'd' is the height of gap regions 130 from first edge 131 to second edge 132. Specifically, epitaxial layer 135 can be grown epitaxially and comprises silicon germanium (i.e., SiGe), which can be p-type doped. Epitaxial layer 135 can be stressed or unstressed, and/or doped or undoped. Gap regions 130 are the regions where current can flow when semiconductor 100 is on. Epitaxial layer 135 can be grown epitaxially and comprises silicon germanium, or silicon-germanium doped with boron (i.e., in-situ boron doped SiGe), or other p-type dopants. In the present embodiment, semiconductor 100 is a p-type CMOS transistor, wherein p-type dopants can be utilized to dope epitaxial layer 135. However, in alternative embodiments, semiconductor 100 can be an n-type CMOS transistor, wherein epitaxial layer 135 can be grown epitaxially and comprises silicon-carbide (SiC), and wherein the epitaxial layer may be doped with n-type dopants that can include phosphorus, arsenic, or antimony.

Figure 1H:
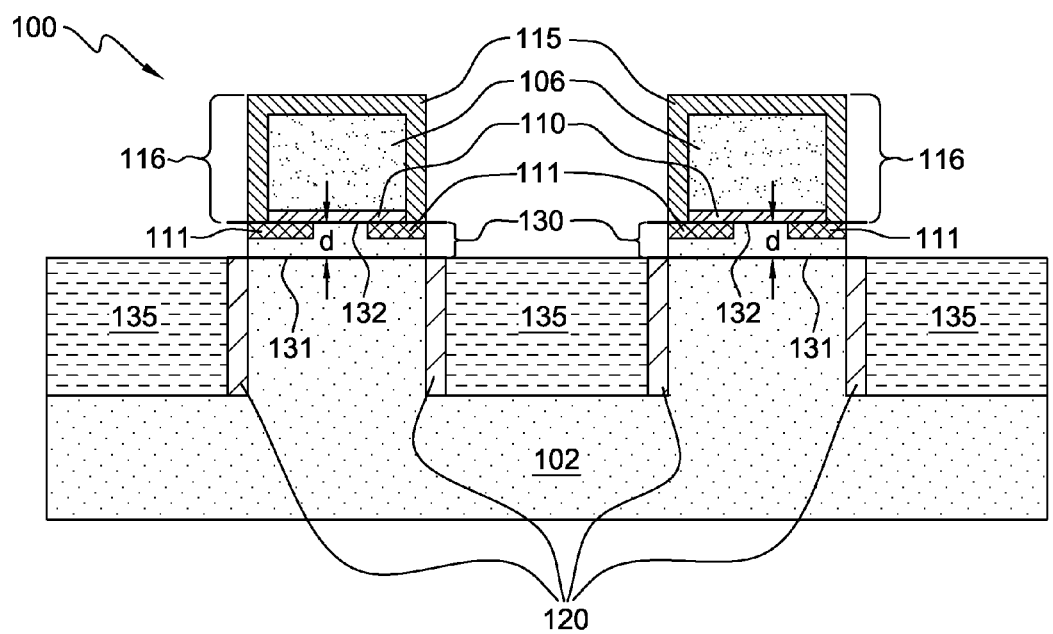

Subsequently, in FIG. 1H a portion of second dielectric spacer 120 is removed utilizing anisotropic reactive ion etching (RIE), wherein the portion of the second dielectric spacer that is removed is above first edge 131 of gap regions 130. In the present embodiment, anisotropic RIE is utilized to remove a portion of the second dielectric spacer 120, but any other conventional method may be utilized which can include isotropic RIE, wet etching, plasma etching, or ion milling.

Figure 1I:
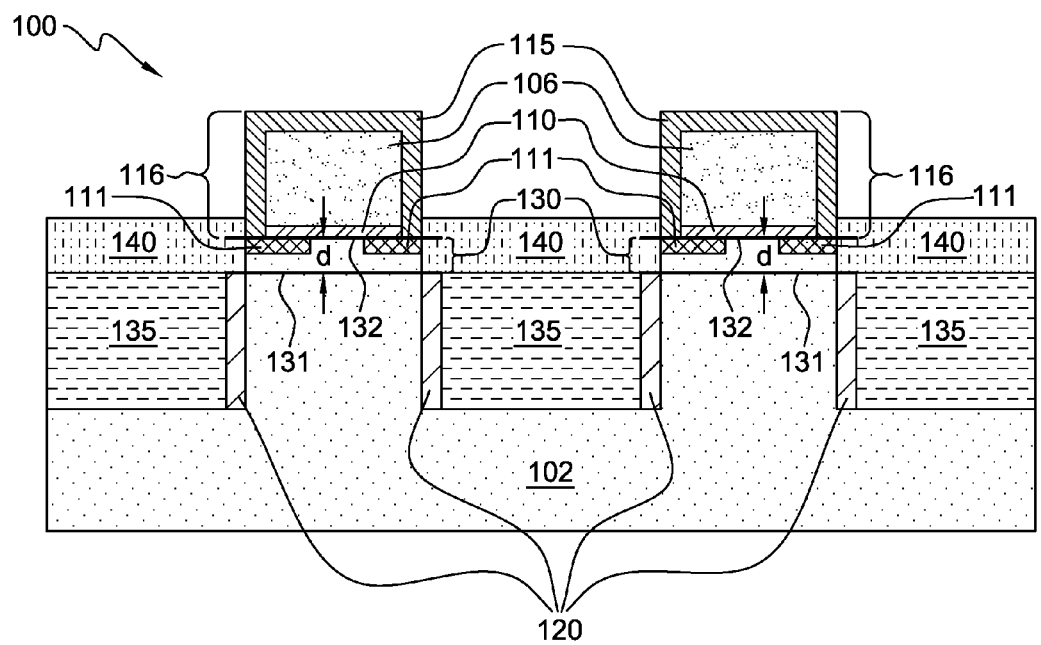

FIG. 1I, illustrates a cross-sectional view of semiconductor 100 at a successive stage of fabrication, wherein the substrate utilized to fabricate the semiconductor is bulk silicon, and wherein epitaxial layer 140 is grown on epitaxial layer 135 and second dielectric spacer 120. Epitaxial layer 135 and 140, which are between adjacent gates, are utilized to form source and drain regions. Epitaxial layer 140 can be grown epitaxially and comprises silicon germanium (i.e., SiGe), or silicon-germanium doped with boron (i.e., in-situ boron doped SiGe), or other p-type dopants. In addition, epitaxial layer 140 can be stressed or unstressed, and/or doped or undoped. Specifically, epitaxial layer 140 can be doped by performing an optional implant and anneal, but if the epitaxial layer is already doped, then the optional implant and anneal does not have to be performed. In the present embodiment, semiconductor 100 is a p-type CMOS transistor, wherein p-type dopants can be utilized to dope epitaxial layer 140. However, in alternative embodiments, semiconductor 100 can be an n-type CMOS transistor, wherein epitaxial layer 140 can be grown epitaxially and comprises silicon-carbide (SiC), and wherein the epitaxial layer may be doped with n-type dopants that can include phosphorus, arsenic, or antimony.

Figure 1J:
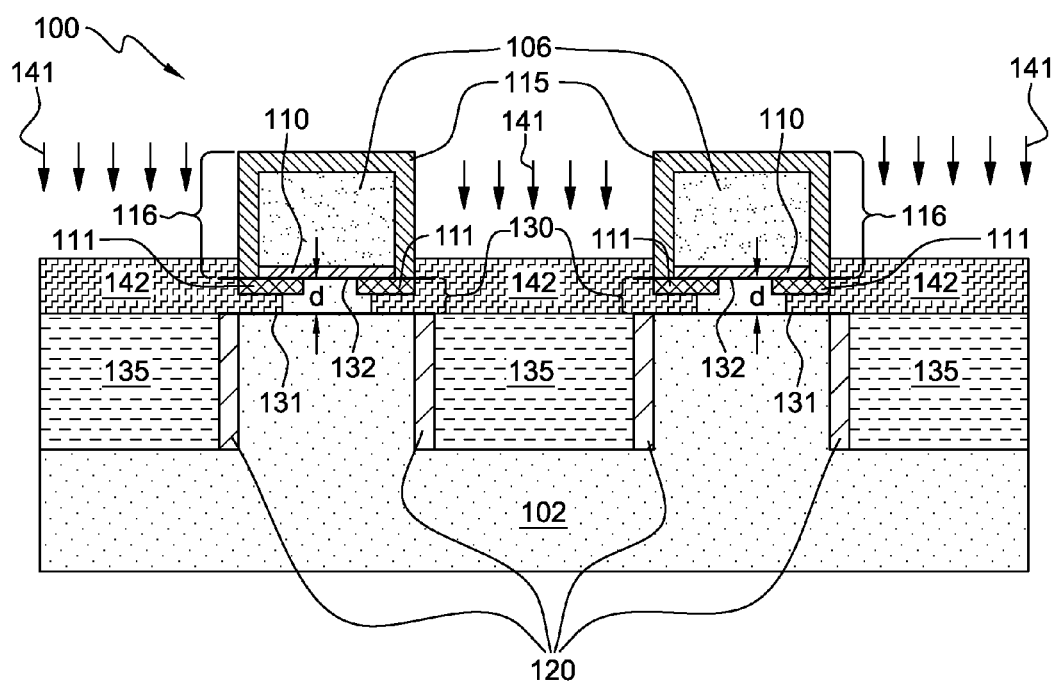
FIG. 1J is a cross-sectional view of an alternative embodiment of semiconductor structures during the fabrication of a CMOS field effect transistor, wherein an optional implant and anneal process can be performed.

FIG. 1J illustrates an alternative embodiment, wherein an optional implant and anneal process 141 can be performed. As a result of optional implant and anneal process 141, epitaxial layer 140 (shown in FIG. 1I) is doped with a p-type dopant such as boron or other p-type dopants to form a doped epitaxial layer 142. Thus, to perform optional implant and anneal process 141, ion implantation and annealing can be utilized, or any other conventional method can be used to implant and diffuse dopants throughout epitaxial layer 140. Specifically, the optional implant and anneal process 141 causes dopants to implant and diffuse into gap regions 130 of substrate 102. However, the presence of second dielectric spacer 120 minimizes lateral straggle below first edge 131 of gap regions 130, which mitigates an undesired increase in leakage current. Moreover, extensions 111 can be shallowly doped and comprise a different p-type dopant than epitaxial layer 135 and/or epitaxial layer 142, or the extensions can comprise the same p-type dopant as epitaxial layer 135 and/or epitaxial layer 142. Also, optional implant and anneal process 141 can cause the dopants of doped epitaxial layer 142 to diffuse into gap regions 130, and diffuse slightly below first edge 131 of the gap regions. In addition, dopants of doped epitaxial layer 142 can overlap extensions 111, and even diffuse slightly into epitaxial layer 135. In an alternative embodiment, formation of extensions 111 (shown in FIGS. 1A and 1B) can be omitted if optional implant and anneal process 141 is performed, because the optional implant and anneal process can also be utilized to diffuse dopants under gates 116 to form extensions.

Furthermore, second dielectric spacer 120 can also reduce transistor junction capacitance, because the second dielectric spacer minimizes the size of the interface between doped epitaxial layer 142 and substrate 102. Reducing junction capacitance can improve the performance of semiconductor 100, for example the switching speed of the transistors can increase due to the use of second dielectric spacer 120. Also, the optional ion implantation process 141 can reduce contact resistance, enhance the connectivity between extensions 111 and doped epitaxial layer 142, and minimize the resistance between source and drain, wherein the source and drain are formed by epitaxial layer 135 and 142. In the present embodiment, semiconductor 100 is a p-type CMOS transistor, wherein p-type dopants are utilized to dope epitaxial layer 140 (shown in FIG. 1I) to form doped epitaxial layer 142. However, in alternative embodiments, semiconductor 100 can be an n-type CMOS transistor, wherein epitaxial layer 140 can be grown epitaxially and comprises silicon-carbide (SiC), and wherein the epitaxial layer may be doped with n-type dopants that can include phosphorus, arsenic, or antimony. Epitaxial layer 135 and 142 can comprise the same epitaxial material or different epitaxial material. In addition, epitaxial layer 135 and 142 can be formed as separate layers or as a single layer. In the present embodiment, semiconductor 100 is fabricated utilizing bulk silicon. However, in alternative embodiments, semiconductor 100 may be fabricated utilizing silicon-on-insulator, wherein silicon substrate 102 is disposed on an oxide layer.

Figure 1K:
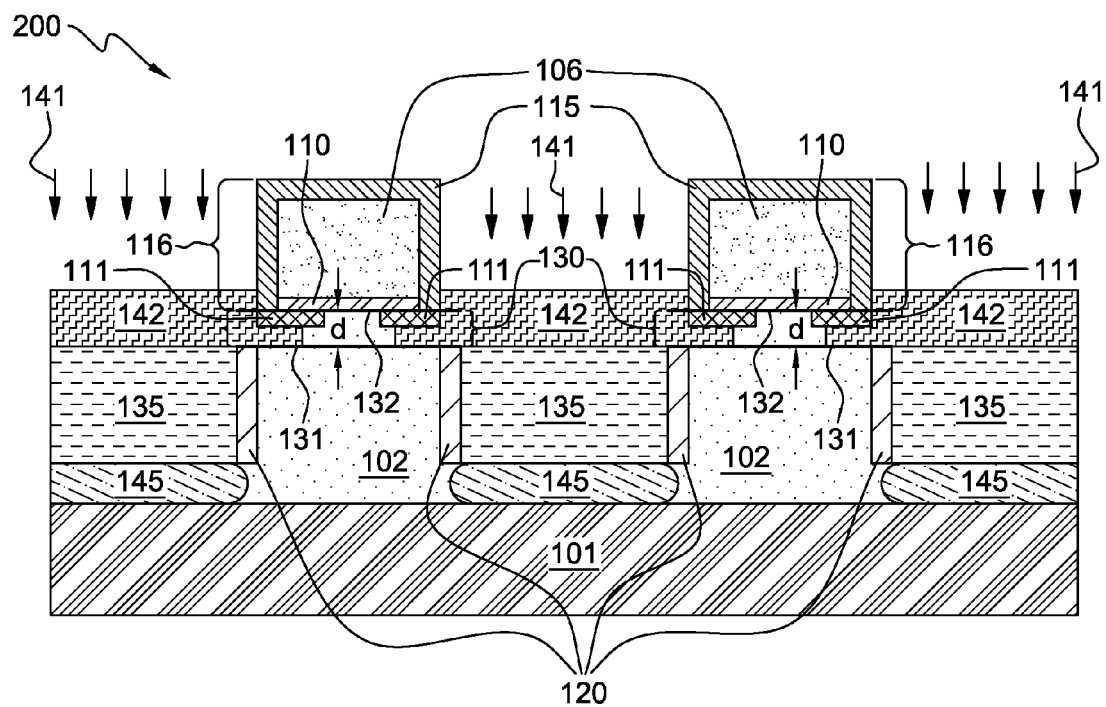
FIG. 1K is a cross-sectional view illustrating an optional junction-butting implant process to electrically decouple portions of body regions (i.e., the body regions are the substrate under the gates) of adjacent transistors.

FIG. 1K, illustrates a cross-sectional view of an alternative embodiment, wherein semiconductor 200 (also shown in FIG. 1B) is fabricated utilizing silicon-on-insulator technology, and wherein substrate 102 is disposed on an oxide layer 101. Specifically, semiconductor 200 comprises oxide layer 101 (also shown in FIG. 1B and FIG. 1F), substrate 102, junction-butting implant layer 145 (also shown in FIG. 1F), extensions 111, spacer 120, gap region 130 with first edge 131 and second edge 132, epitaxial layer 135, doped epitaxial layer 142, and gates 116. Gates 116 further comprise gate dielectric layer 110, poly-silicon and/or metal layer 106, and first dielectric spacer 115.

If semiconductor 200 is fabricated utilizing silicon-on-insulator technology an optional junction-butting implant 125 (shown in FIG. 1F) can be performed utilizing ion implantation. Optional junction-butting implant 125 provides dopants to substrate 102 to form junction-butting implant layer 145, wherein the junction-butting implant layer isolates portions of body regions (i.e., the body regions are the substrate under gates 116) of adjacent transistors. Junction-butting implant layer 145 is doped with an opposite doping profile than that of substrate 102. Accordingly, if substrate 102 is p-type doped, then junction-butting implant layer 145 is n-type doped and vice versa. Moreover, second dielectric spacer 120 mitigates the diffusion of dopants below first edge 131 of gap regions 130, and reduces the size of the interface between doped epitaxial layer 142 and substrate 102. Thus, the presence of second dielectric spacer 120 can mitigate lateral straggle of dopants into portions of body regions (i.e., the substrate 102 under gates 116). For example, second dielectric spacer 120 can mitigate lateral straggle of dopants from optional junction-butting implant 125, from optional implant and anneal process 141, or from in-situ doping. As a result, second dielectric spacer 120 minimizes leakage current and reduces transistor junction capacitance.

Furthermore, those skilled in the art will note from the above description, that presented herein is a novel apparatus and method for forming a complementary metal-oxide-semiconductor field effect transistor utilizing dielectric spacers to minimize leakage current, lateral straggle of implanted dopants, and transistor junction capacitance. Minimizing leakage current, lateral straggle of implanted dopants, and transistor junction capacitance can enhance the utility and performance of CMOS transistors in low power applications. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A semiconductor device comprising:
    a substrate;
    gates disposed on the substrate and spaced at a distance from each other, wherein a first dielectric spacer is disposed on and adjacent to the gate;
    one or more trenches in the substrate between each of the gates;
    a second dielectric spacer disposed on and adjacent to the first dielectric spacer and the substrate between the gates, wherein a portion of the second dielectric spacer is removed; and
    one or more epitaxial layers disposed on and adjacent to the second dielectric spacer and a portion of the substrate between the gates, wherein a selective portion of the substrate that is below all the one or more epitaxial layers further comprises a junction-butting implant layer that is doped with an opposite doping type than the substrate doping type.

2. The semiconductor device of claim 1, wherein the semiconductor device further comprises a complementary metal-oxide-semiconductor (CMOS) field effect transistor.

3. The semiconductor device of claim 2, wherein the substrate comprises bulk silicon or silicon-on-insulator, and wherein the portion of the substrate is doped with p-type or n-type dopants.

4. The semiconductor device of claim 3, wherein extensions are formed in a portion of the substrate, below a portion of the gates, and between the gates.

5. The semiconductor device of claim 4, wherein the one or more trenches are formed utilizing reactive ion etching (RIE), anisotropic RIE, isotropic RIE, wet etching, plasma etching, or ion milling.

6. The semiconductor device of claim 5, wherein the first dielectric spacer and the second dielectric spacer includes nitride, oxide, or any other dielectric material.

7. The semiconductor device of claim 6, wherein:
    the portion of the second dielectric spacer that is removed provides a gap region for current to flow;
    the second dielectric spacer minimizes the size of the interface between the one or more epitaxial layers and the substrate, which also minimizes transistor junction capacitance and minimizes leakage current during periods of time when the complementary metal-oxide-semiconductor (CMOS) field effect transistor is off; and
    the second dielectric spacer minimizes lateral straggle of ions during ion implantation or other conventional doping techniques.

8. The semiconductor device of claim 7, wherein:
    the one or more epitaxial layers comprise silicon-germanium,
    silicon-germanium doped with p-type dopants, silicon-carbide, or silicon-carbide doped with n-type dopants; and
    the one or more epitaxial layers are doped utilizing techniques that include ion implantation and anneal, and rapid thermal processing to form extensions, source regions, and drain regions.

* * * * *